(12) United States Patent
Madson

(10) Patent No.: US 8,497,549 B2
(45) Date of Patent: Jul. 30, 2013

(54) METHOD AND STRUCTURE FOR SHIELDED GATE TRENCH FET

(75) Inventor: Gordon K. Madson, Herriman, UT (US)

(73) Assignee: Fairchild Semiconductor Corporation, South Portland, ME (US)

(*) Notice: Subject to any disclaimer, the term of this patent is extended or adjusted under 35 U.S.C. 154(b) by 813 days.

(21) Appl. No.: 11/848,124

(22) Filed: Aug. 30, 2007

(65) Prior Publication Data

US 2009/0050959 A1 Feb. 26, 2009

Related U.S. Application Data

(60) Provisional application No. 60/956,980, filed on Aug. 21, 2007.

(51) Int. Cl.
*H01L 29/66* (2006.01)
(52) U.S. Cl.
USPC .................................. 257/330; 257/E29.257
(58) Field of Classification Search
USPC .......................................... 257/330, E29.257
See application file for complete search history.

(56) References Cited

U.S. PATENT DOCUMENTS

| | | | |
|---|---|---|---|
| 6,351,018 B1 | 2/2002 | Sapp | |
| 6,861,296 B2 | 3/2005 | Hurst et al. | |
| 6,939,781 B2 | 9/2005 | Redd et al. | |
| 6,974,996 B2 * | 12/2005 | Shiga et al. | 257/330 |
| 7,005,353 B2 | 2/2006 | Kocon et al. | |
| 8,252,647 B2 * | 8/2012 | Lee et al. | 438/270 |
| 8,362,551 B2 * | 1/2013 | Hirler et al. | 257/330 |
| 2004/0031987 A1 * | 2/2004 | Henninger et al. | 257/328 |
| 2005/0151188 A1 * | 7/2005 | Nakamura | 257/330 |
| 2005/0167742 A1 | 8/2005 | Challa et al. | |
| 2005/0173758 A1 * | 8/2005 | Peake et al. | 257/330 |
| 2006/0170062 A1 | 8/2006 | Kim et al. | |
| 2006/0214222 A1 | 9/2006 | Challa et al. | |
| 2006/0267090 A1 | 11/2006 | Sapp et al. | |
| 2006/0273386 A1 | 12/2006 | Yilmaz et al. | |
| 2007/0190728 A1 | 8/2007 | Sreekantham et al. | |

OTHER PUBLICATIONS

PCT, International Search Report of The International Searching Authority for Application No. PCT/US08/73371, Nov. 3, 2008.
PCT, Written Opinion of The International Searching Authority for Application No. PCT/US08/73371, Nov. 3, 2008.

* cited by examiner

*Primary Examiner* — Benjamin Sandvik

(57) ABSTRACT

A shielded gate field effect transistor includes a trench extending into a semiconductor region. A shield electrode is in a lower portion of the trench, and is insulated from the semiconductor region by a shield dielectric. The shield dielectric comprises first and second dielectric layers, the first dielectric layer extending between the second dielectric layer and the semiconductor region. The second dielectric layer comprises a material which during oxidation process inhibits growth of oxide along surfaces of the semiconductor region covered by the second dielectric layer. An inter-electrode dielectric overlies the shield electrode, and a gate dielectric lines upper trench sidewalls. A gate electrode is in an upper portion of the trench over the inter-electrode dielectric.

24 Claims, 10 Drawing Sheets

METHOD AND STRUCTURE FOR SHIELDED GATE TRENCH FET

CROSS-REFERENCES TO RELATED APPLICATIONS

This application claims the benefit of U.S. Provisional Application No. 60/956,980, filed Aug. 21, 2007, which is incorporated by reference in its entirety for all purposes.

BACKGROUND OF THE INVENTION

The present invention relates in general to semiconductor technology, and more particularly to methods and structures for forming inter-electrode dielectric and gate dielectric in shielded gate trench FETs.

Shielded gate trench FETs are advantageous over conventional FETs in that the shield electrode reduces the gate-drain capacitance (Cgd) and improves the breakdown voltage of the transistor without sacrificing the transistor on-resistance. FIG. 1 is a simplified cross sectional view of a conventional shielded gate trench MOSFET. An n-type epitaxial layer 102 extends over n+ substrate 100. N+ source regions 108 and p+ heavy body regions 106 are formed in a p-type body region 104 which is in turn formed in epitaxial layer 102. Trench 110 extends through body region 104 and terminates in the drift region which is the portion of epitaxial layer 102 extending between body region 104 and substrate 100. Trench 110 includes a shield electrode 114 below a gate electrode 122. Gate electrode 122 is insulated from its adjacent silicon regions by gate dielectric 120, and shield electrode 114 is insulated from its adjacent silicon regions by a shield dielectric 112 which is thicker than gate dielectric 120.

The gate and shield electrodes are insulated from each other by a dielectric layer 116 also referred to as inter-electrode dielectric or IED. IED layer 116 must be of sufficient quality and thickness to support the potential difference that may exist between shield electrode 114 and gate electrode 122 during operation. In addition, it is desirable to have relatively low interface trap charges and dielectric trap charges in IED layer 116 or at the interface between shield electrode 114 and IED layer 116.

Conventional methods for forming the IED layer include thermal oxidation or chemical vapor deposition (CVD). Each of these methods has limitations. For example, the CVD process tends to produce lower quality dielectric and higher charges and traps. On the other hand, in thermal oxidation, both the device channel surface and the shield electrode are oxidized at the same time, and the thickness of the IED is limited by the target thickness of the channel gate dielectric. As a result, even though thermal oxidation often produces higher quality oxide, it is difficult to obtain the desired IED thickness.

Thus, there is a need for structure and method for forming shielded gate trench FETs that enable forming a high-quality IED to the desired thickness without being limited by the target gate dielectric thickness.

BRIEF SUMMARY OF THE INVENTION

In accordance with an embodiment of the invention, a shielded gate field effect transistor includes a trench extending into a semiconductor region. A shield electrode is in a lower portion of the trench, and is insulated from the semiconductor region by a shield dielectric. The shield dielectric comprises first and second dielectric layers, the first dielectric layer extending between the second dielectric layer and the semiconductor region. The second dielectric layer comprises a material which during oxidation process inhibits growth of oxide along surfaces of the semiconductor region covered by the second dielectric layer. An inter-electrode dielectric overlies the shield electrode, and a gate dielectric lines upper trench sidewalls. A gate electrode is in an upper portion of the trench over the inter-electrode dielectric.

In one embodiment, the first dielectric layer extends along the trench sidewalls, portions of the first dielectric layer extending along upper trench sidewalls forming the gate dielectric.

In another embodiment, the first and second dielectric layers extend along the trench sidewalls, and portions of the first and second dielectric layer extending along upper trench sidewalls form the gate dielectric.

In one embodiment, the first dielectric layer comprises an oxide layer, the second dielectric layer comprises a silicon nitride layer, and the gate dielectric comprises a gate oxide layer.

In another embodiment, the gate dielectric further comprises a silicon nitride layer.

In another embodiment, the inter-electrode dielectric comprises thermal oxide and has a thickness greater than a thickness of the gate dielectric.

In another embodiment, the shield dielectric further comprises a third dielectric layer, the second dielectric layer extending between the first and third dielectric layers.

In another embodiment, each of the first and third dielectric layers comprises an oxide layer and the second dielectric layer comprises a silicon nitride layer.

In another embodiment, the third dielectric layer has a thickness greater than a thickness of each of the first and second dielectric layers.

In accordance with another embodiment of the invention, a method of forming shielded gate field effect transistor includes the following steps. A trench is formed in a semiconductor region. First, second and third dielectric layers are formed extending along trench sidewalls and a bottom surface of the trench, the second dielectric layer being formed after the first dielectric layer and the third dielectric layer being formed after the second dielectric layer. A shield electrode is formed in a lower portion of the trench, the shield electrode being insulated from the semiconductor region by the first, second and third dielectric layers. Portions of the third dielectric layer extending along upper trench sidewalls are removed thereby exposing corresponding portions of the second shield dielectric layer. An inter-electrode dielectric is formed in the trench. A gate electrode is formed in the trench over the inter-electrode dielectric.

In one embodiment, each of the first and third dielectric layers comprises an oxide layer and the second dielectric layer comprises a silicon nitride layer.

In another embodiment, the inter-electrode dielectric comprises thermal oxide and has a thickness greater than a combined thicknesses of the first and second dielectric layers.

In another embodiment, the third dielectric layer has a thickness greater than a thickness of each of the first and second dielectric layers.

In another embodiment, the inter-electrode dielectric is formed by oxidizing the shield electrode. In yet another embodiment, the second dielectric layer comprises silicon nitride so that during oxidizing the shield electrode the silicon nitride inhibits growth of oxide along surfaces of the semiconductor region covered by the second dielectric layer.

In another embodiment, the step of forming an inter-electrode dielectric comprises includes the following steps. A polysilicon liner is formed extending over the shield electrode and along upper trench sidewalls over the second dielectric layer. An oxidation process is then performed to convert the polysilicon liner to oxide. In one embodiment, the oxidation process also converts an upper portion of the shield electrode to oxide.

In another embodiment, prior to forming the gate electrode, the exposed portions of the second dielectric layer extending along upper trench sidewalls are removed to thereby expose corresponding portions of the first dielectric layer, the portions of the first dielectric layer corresponding to the removed portions of the second dielectric layer forming a gate dielectric insulating the gate electrode from the semiconductor region.

In another embodiment, prior to forming the gate electrode: (1) portions of the first and second dielectric layers extending along upper trench sidewalls are removed thereby exposing corresponding portions of the trench sidewalls, and (2) an oxidation process is performed to form an oxide layer along the portions of the trench sidewalls corresponding to the removed portions of first and second dielectric layers, the oxide layer forming a gate dielectric insulating the gate electrode from the semiconductor region.

In another embodiment, prior to forming the gate electrode: (1) the exposed portions of the second dielectric layer extending along upper trench sidewalls are removed thereby exposing corresponding portions of the first dielectric layer, and (2) an oxidation process is performed to form a thermal oxide layer along upper trench sidewalls, the thermal oxide layer together with the portions of the first dielectric layer corresponding to the removed portions of the second dielectric layer forming a gate dielectric insulating the gate electrode from the semiconductor region.

In accordance with yet another embodiment of the invention, a method for forming a shielded gate field effect transistor includes the following steps. A trench is formed in a semiconductor region. First and second dielectric layers extending along sidewalls and a bottom surface of the trench are formed, the second dielectric layer being formed after the first dielectric layer. A shield electrode is formed in a lower portion of the trench. An inter-electrode dielectric is formed in the trench. The shield electrode is oxidized to form an inter-electrode dielectric. The second dielectric layer comprises a material which inhibits oxide growth along upper trench sidewalls during oxidizing the shield electrode. Portions of the first and second dielectric layers extending along upper trench sidewalls are removed to expose corresponding portions of upper trench sidewalls. A gate dielectric lining the exposed upper trench sidewalls is formed. A gate electrode is formed in the trench over the inter-electrode dielectric.

In one embodiment, the first dielectric layer comprises an oxide layer and the second dielectric layer comprises a silicon nitride layer.

In another embodiment, the inter-electrode dielectric comprises thermal oxide and has a thickness greater than a thickness of the gate dielectric.

In another embodiment, the first dielectric layer has a thickness greater than a thickness of the second dielectric layer.

The following detailed description and the accompanying drawings provide a better understanding of the nature and advantage of the present invention.

DETAILED DESCRIPTION OF THE INVENTION

In accordance with embodiments of the invention, various techniques are described for forming inter-electrode dielectric (IED) and gate dielectric in shielded gate trench FETs. In one embodiment, a composite dielectric layer of nitride and oxide is used for protecting the surface of the trench sidewalls when the shield electrode is being oxidized to form the IED. High quality IED can be advantageously formed by thermal oxidation to a desired thickness. In one embodiment, the composite dielectric layer is used as the gate dielectric, which provides a barrier to mobile ions and moisture and also adds robustness to process defects. In one variation of the invention, a polysilicon liner is deposited and oxidized to reduce sharp recessed corners of the IED thereby substantially minimizing the electric field at bottom corners of the gate electrode. In alternate embodiments, techniques are provided for removing the nitride layer from the gate dielectric, which is desirable in applications requiring low dielectric charges and traps. These and other embodiments of the invention, as well as other features and advantages of the invention will be described in more detail next.

FIGS. 2A-2J are simplified cross-sectional views illustrating a process flow for forming a shielded gate trench field effect transistor according to an embodiment of the present invention. The following description of the steps in the process flow is only exemplary, and it should be understood that the scope of the invention is not limited to this specific example. In particular, processing conditions such as temperature, pressure, layer thicknesses could be varied without departing from the spirit of the invention.

Figure 1:
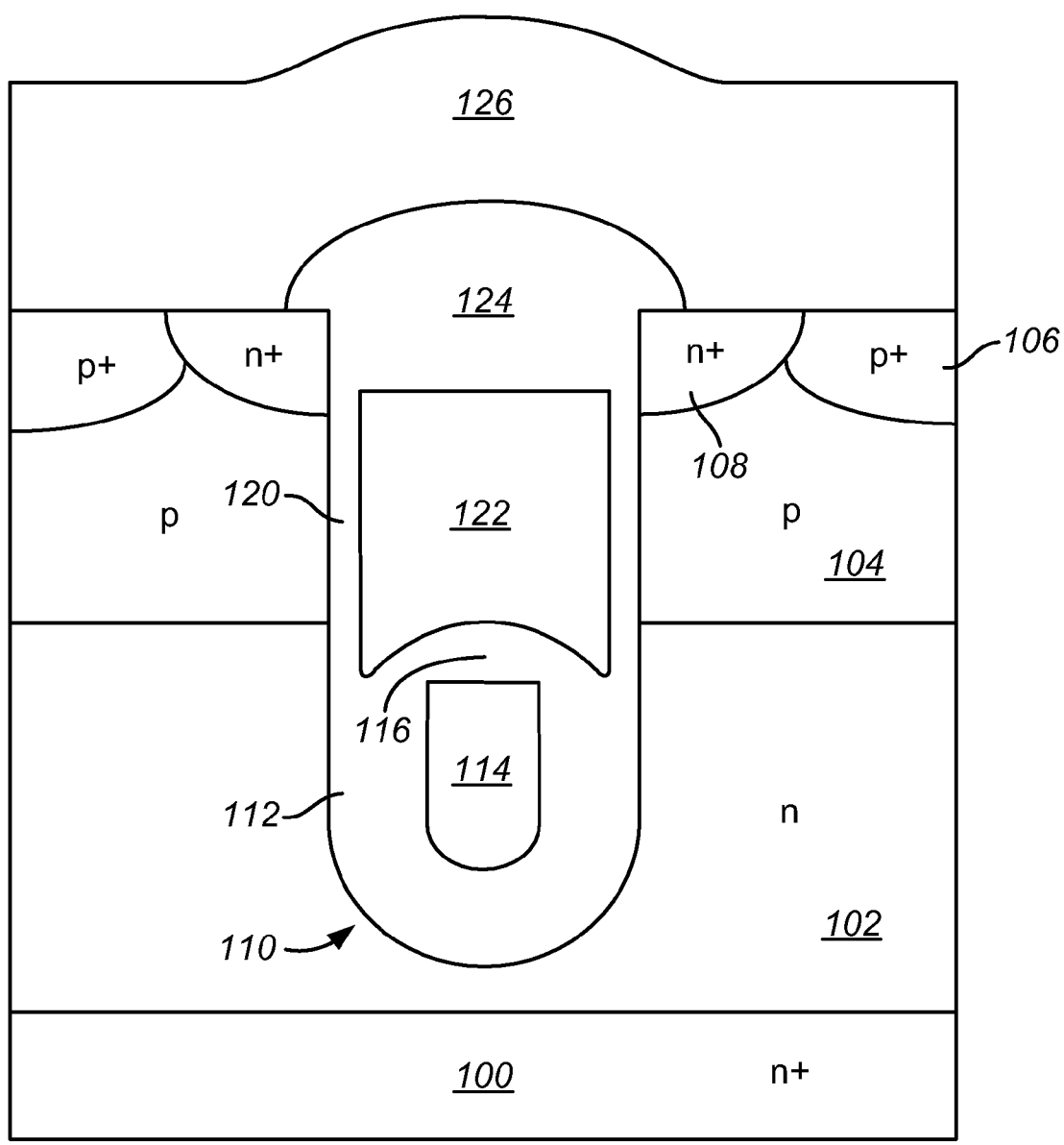
FIG. 1 shows a cross-sectional view illustrating a conventional shielded gate trench MOSFET.
Figure 2A:
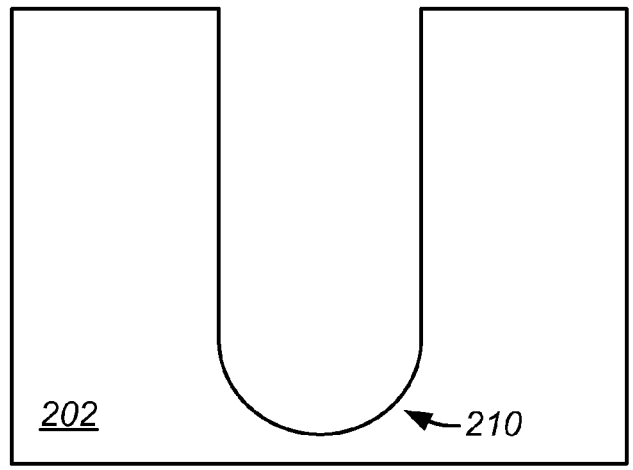
FIGS. 2A-2J are simplified cross-sectional views illustrating a process flow for forming a shielded gate trench field effect transistor including an oxide/nitride gate dielectric according to an embodiment of the present invention.

In FIG. 2A, using conventional techniques, trench 210 is formed in a semiconductor region 202. In one embodiment semiconductor region 202 includes a highly doped substrate (e.g., n-type in case of an n-channel MOSFET) and an epitaxial layer (e.g., n-type in case of an n-channel MOSFET) overlying the substrate, and trench 202 extends into and terminates within the epitaxial layer. In another variation, trench 202 extends through the epitaxial layer and terminates within the substrate. Note that the various dimensions in the figures of this application are not to scale and at times are exaggerated or reduced in size to more clearly show various structural features.

Figure 2B:
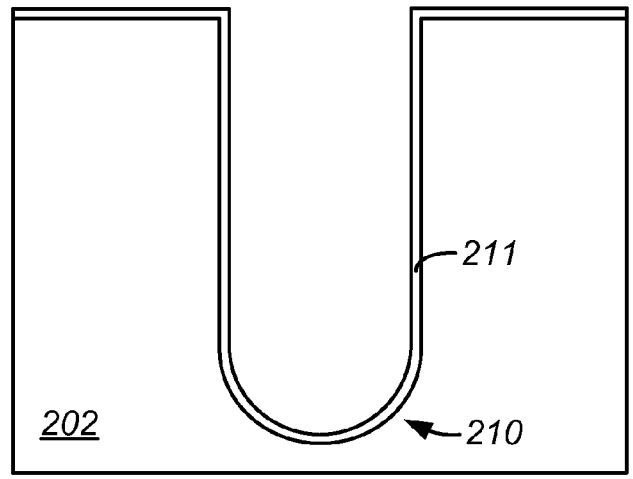
Figure 2C:
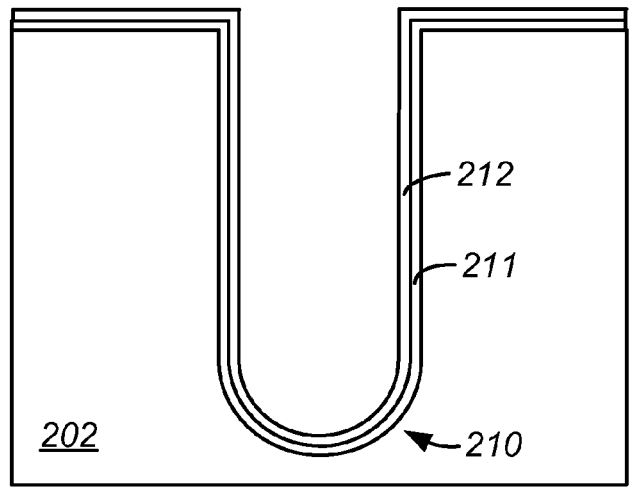

In FIG. 2B, a first shield dielectric layer 211 is formed lining the trench sidewalls and bottom and extending over mesa regions adjacent the trench, using conventional techniques. In one embodiment, shield dielectric layer 211 is formed to the desired thickness using thermal oxidation of silicon. In FIG. 2C, a second shield dielectric layer 212 comprising dielectric material different than that of first shield dielectric layer 211 is formed overlying first shield oxide layer 211, using conventional techniques. As will be seen, one purpose second shield dielectric layer 212 serves is to inhibit oxide growth along the trench sidewalls (and in some embodiments over the mesa surfaces) during the later process steps. In one embodiment, second dielectric layer 212 comprises silicon nitride formed using, for example, CVD process.

Figure 2D:
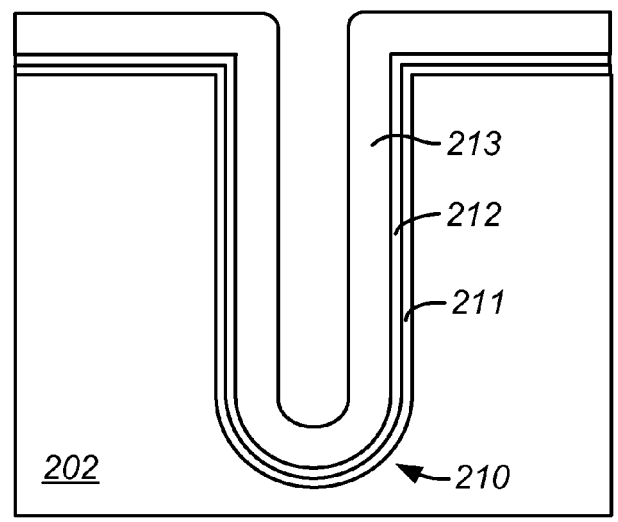

In FIG. 2D, a third shield dielectric layer 213 comprising dielectric material different than that of second shield dielectric layer 212 is formed overlying second shield dielectric layer 212. In one embodiment, second dielectric layer 212 comprises oxide formed using, for example, CVD. Note that the thicknesses of the three shield dielectric layers may be selected based on device performance requirements. In one embodiment, first shield dielectric layer 211 may be an oxide layer with a thickness dictated by the desired gate oxide thickness, e.g., in the range of 50-500 Å. In another embodiment, second shield dielectric layer 212 may be a silicon nitride layer thick enough, e.g., in the range of 100-300 Å, to prevent oxide growth along trench sidewalls and upper mesa surfaces during later process steps. In yet another embodiment, third shield dielectric layer 213 may be an oxide layer thick enough, e.g., in the range of 500-5,000 Å, to withstand high voltages and to minimize gate to drain capacitance. Of course, there can be other variations, modifications, and alternatives.

Figure 2E:
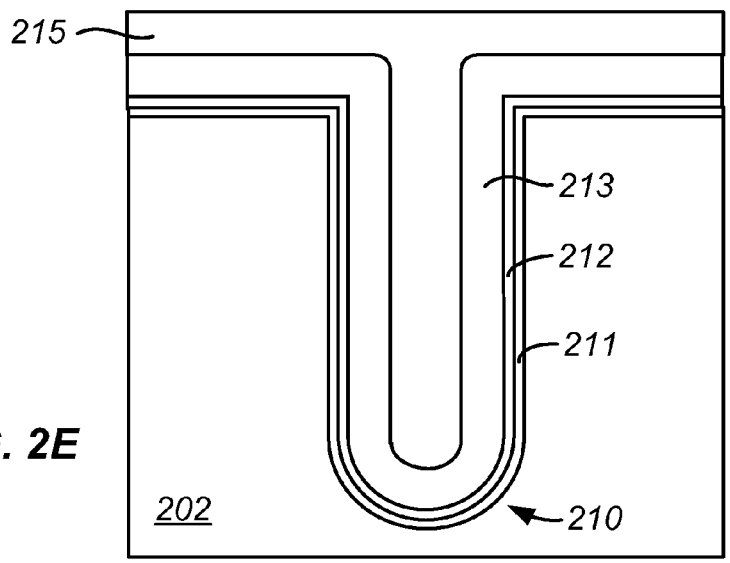
Figure 2F:
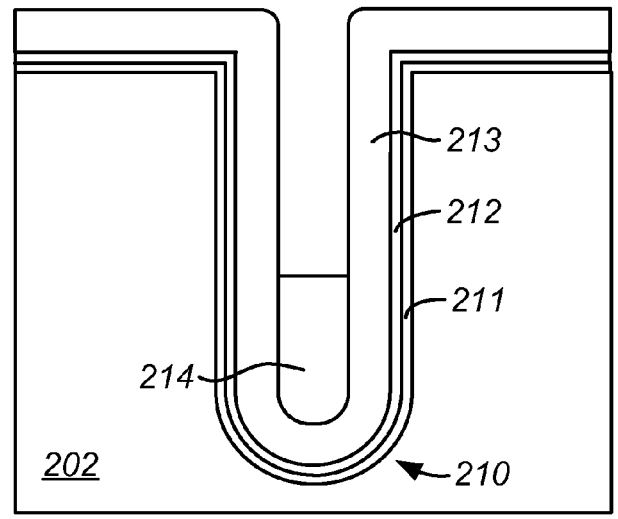

In FIGS. 2E-2F, a shield electrode is formed along a bottom portion of trench 210. As shown in FIG. 2E, using known techniques, a conductive material 215 (e.g., comprising doped or undoped polysilicon) is formed filling the trench and extending over the mesa regions. Subsequently, as shown in FIG. 2F, conductive material 215 is recessed deep into trench 210 to form shield electrode 214.

Figure 2G:
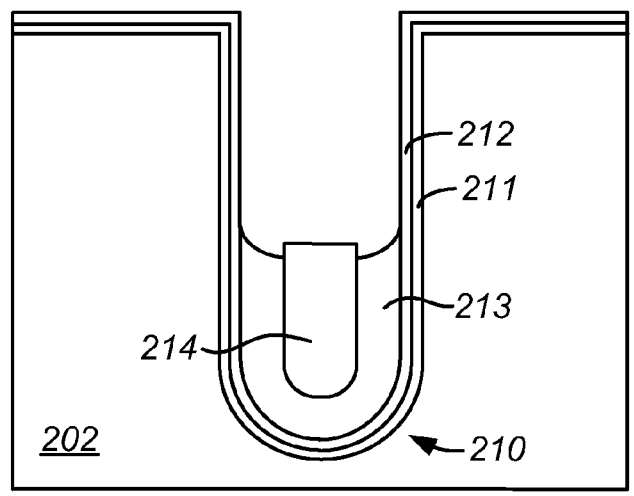

In FIG. 2G, using known dielectric etch methods, exposed portions of third shield dielectric layer 213 along upper trench sidewalls and over mesa surfaces are removed. In one embodiment where second dielectric layer 212 comprises silicon nitride and third dielectric layer 213 comprises oxide, a conventional oxide etch with silicon nitride as etch stop is used. Portions of second shield dielectric layer 212 along upper trench sidewalls and over mesa regions are thus exposed. This process results in the third shield dielectric layer 213 being recessed below the top surface of shield electrode 214 as shown.

Figure 2H:
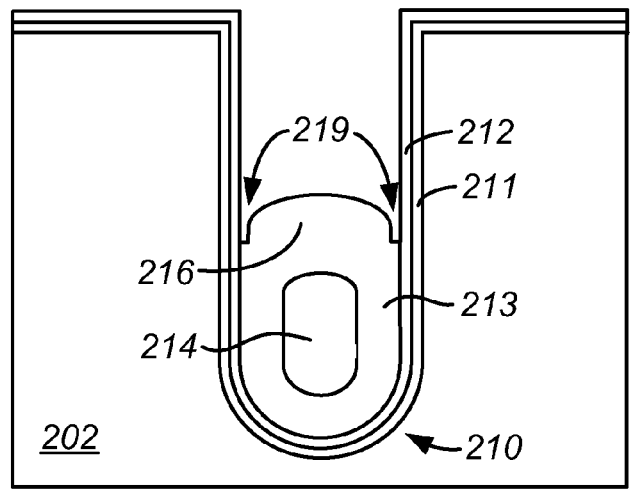

In FIG. 2H, an inter-electrode dielectric (IED) 216 is formed over shield electrode 214. In one embodiment, polysilicon shield electrode 214 is oxidized using a conventional oxidation process to form IED 216. The oxidation process results in formation of sharp recesses 219 at upper corners of IED 216 due to the contour of the upper surface of recessed third dielectric layer 213. In the embodiment where second shield dielectric layer 212 comprises silicon nitride, second shield dielectric layer 212 prevents oxidation of silicon along the upper trench sidewalls and the mesa surfaces. As discussed further below, the embodiment where second shield dielectric layer 212 comprises silicon nitride allows the IED to be formed independently of the gate dielectric, and thus to any desired thickness.

Figure 2I:
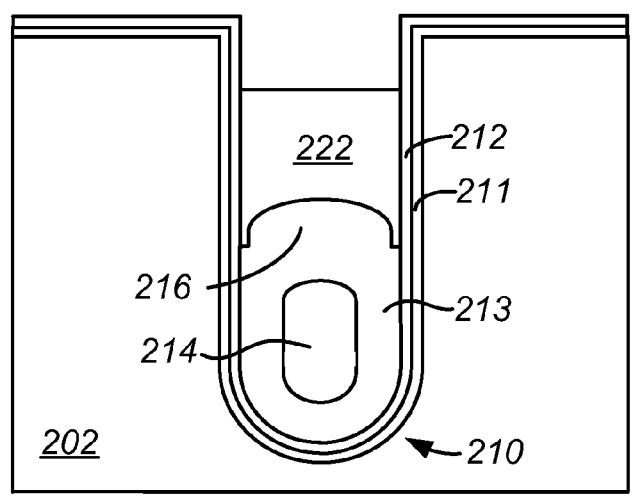

In FIG. 2I, using conventional techniques, a second conductive layer (e.g., comprising doped polysilicon) is formed filling trench 210 and extending over the mesa surfaces. The second conductive layer is then recessed into trench 210 to form gate electrode 222. As can be seen, first and second shield dielectric layers 211, 212 form the gate dielectric along upper trench sidewalls.

Figure 2J:
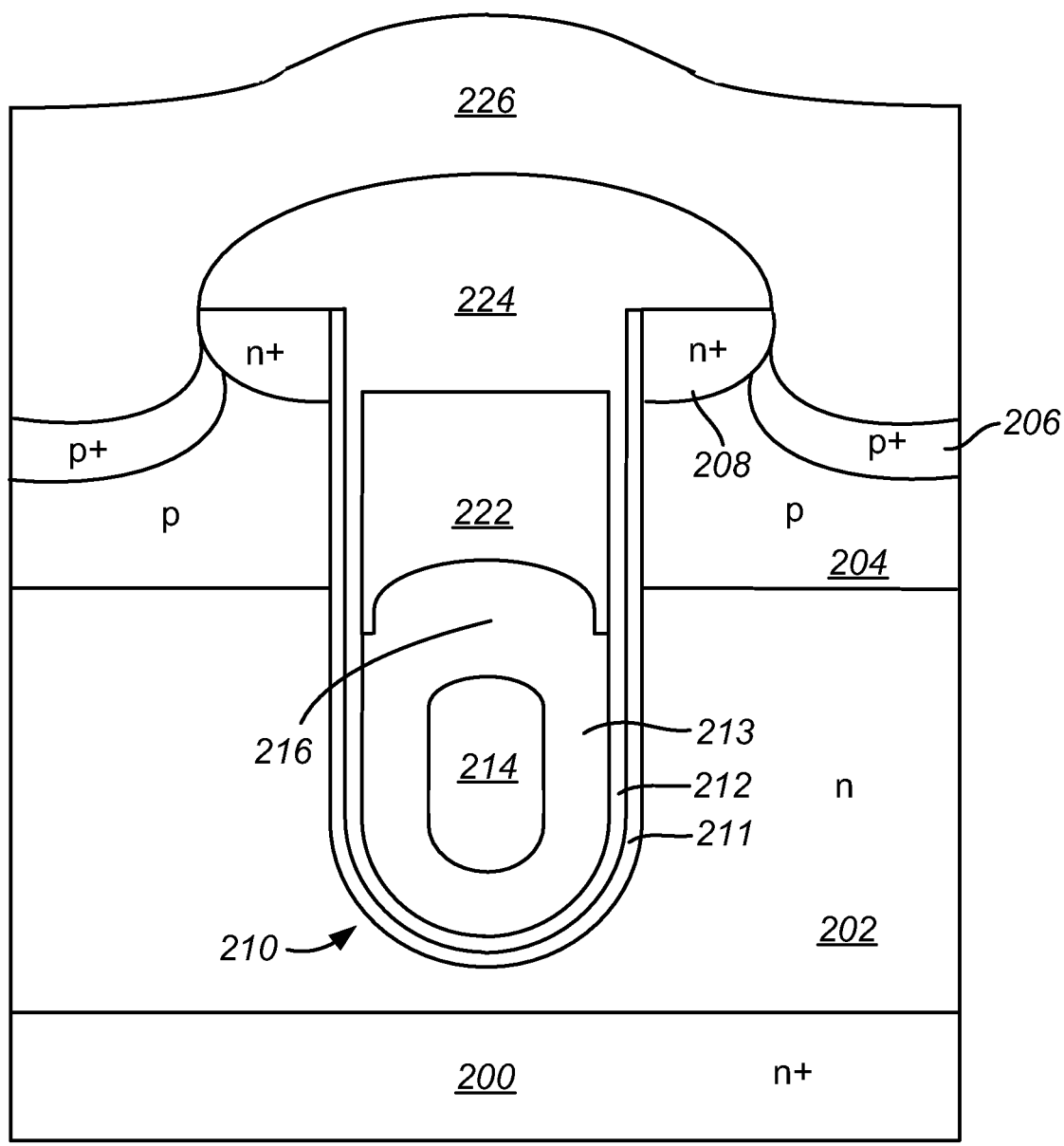

Any number of known process steps may next be carried out to complete the FET structure. FIG. 2J shows one exemplary MOSFET structure. P-type body region 204, n-type source regions 208 and p-type heavy body regions are formed in n-type epitaxial layer 202 using conventional implanting and drive-in techniques. Dielectric cap 224 (e.g., comprising BPSG) is formed over gate electrode 222 using known techniques. Top-side interconnect layer 226 (e.g., comprising metal) is formed to electrically contact source regions 208 and heavy body regions 206. A back-side drain interconnect (not shown), e.g., comprising metal, is formed on the back side to electrically contact heavily doped n-type substrate 200 using known methods. In FIG. 2J, the shield dielectric is a composite layer comprising three dielectric layers 211, 212, 213, whereas the gate dielectric is a composite layer comprising two dielectric layers 211, 212. In one embodiment, the middle dielectric layer 212 comprises a different dielectric material (e.g., silicon nitride) than the other two dielectric layers 211, 213 (e.g., oxide).

According to a specific embodiment of the present invention, polysilicon shield electrode 214 can be oxidized to form a thick IED while silicon nitride layer 212 protects the upper trench sidewalls and mesa surfaces from oxidation. The thickness of the IED can thus be selected independently from the thickness of the gate dielectric. A thick IED is desirable because it reduces capacitive coupling between gate and shield electrodes and improves the transistor switching performance. Thus, a high performance transistor can be obtained using a simple manufacturing process provided by embodiments of the invention. Additionally, since the trench sidewall and mesa surfaces are protected from oxidation, neither the critical dimension of the trench nor the mesa regions are affected by the IED thermal oxidation.

As stated above in connection with FIG. 2H, the thermal oxidation process used to form IED 216 results in formation of sharp recesses 219 in upper corners of IED 216, which in turn results in formation of sharp spikes at the bottom corners of gate electrode 222. These sharp corners may result in higher electric fields, may cause lower breakdown voltages, and may reduce device reliability. In accordance with another embodiment of the invention, a technique is use to prevent formation of sharp recesses 219 in upper corners of the IED thus eliminating the sharp spikes at the bottom corners of the gate electrode, as discussed next.

Figure 3A:
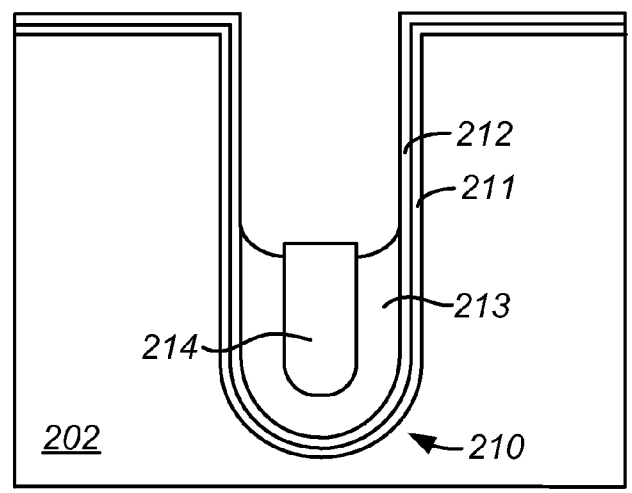
FIGS. 3A-3D are simplified cross-sectional views at various stages of a process for forming a shielded gate trench field effect transistor including an oxide/nitride gate dielectric according to another embodiment of the present invention.

FIGS. 3A-3D are simplified cross-sectional views at various stages of a process for forming a shielded gate trench field effect transistor according to another embodiment of the present invention. In FIG. 3A, an intermediate structure is formed using the processes discussed above in connection with FIGS. 2A-2G, with corresponding regions marked by identical reference numerals.

Figure 3B:
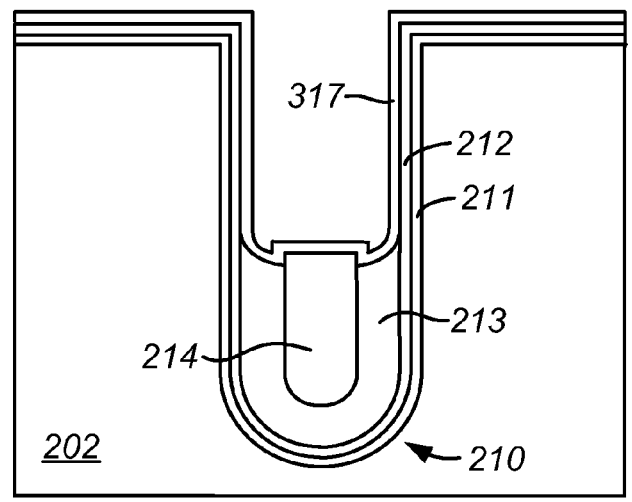
Figure 3C:
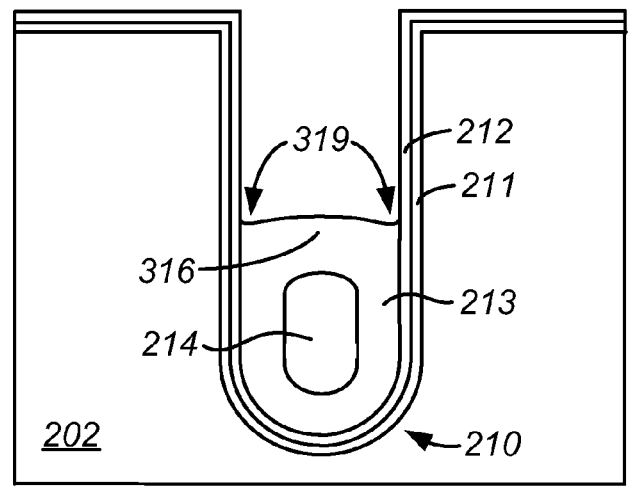

In FIG. 3B, using known techniques, a polysilicon liner 317 is formed overlying the exposed portions of second shield dielectric layer 212 and the upper surface of shield electrode 214. Polysilicon liner 317 also lines the top surface of the recessed third dielectric layer 213. In FIG. 3C, polysilicon liner 317 is completely oxidized in a conventional silicon oxidation process, for example, a dry oxidation process. Then another silicon oxidation process, for example, a wet oxidation process, is carried out to oxidize shield electrode 314 to form IED 316. Alternatively, the IED may be formed by oxidizing the polysilicon liner and the shield electrode in a single wet oxidation process.

Next, the exposed portions of the oxidized polysilicon liner along upper trench sidewalls and over the mesa surfaces are removed using known techniques. In an alternate embodiment, the portions of the oxidized polysilicon liner along upper trench sidewalls are left in the structure to become part of the gate dielectric (the thicknesses of first dielectric layer 211 and second dielectric layer 212 may be adjusted down to account for the additional oxide layer along upper trench sidewalls).

As can be seen in FIG. 3C, little to no recess exists in upper corners 319 of IED 316. As a result, sharp spikes at bottom corners of the gate electrode (see FIG. 3D) are eliminated, and problems associated with high electric fields and low breakdown voltage are avoided. In general, the thickness of the polysilicon liner 317 may be selected as required to eliminate gate electrode spikes. In one embodiment, a thickness of polysilicon liner 317 in the range of 250-350 Å ensures that no recesses are formed in the IED upon completion of the oxidation cycle(s).

Figure 3D:
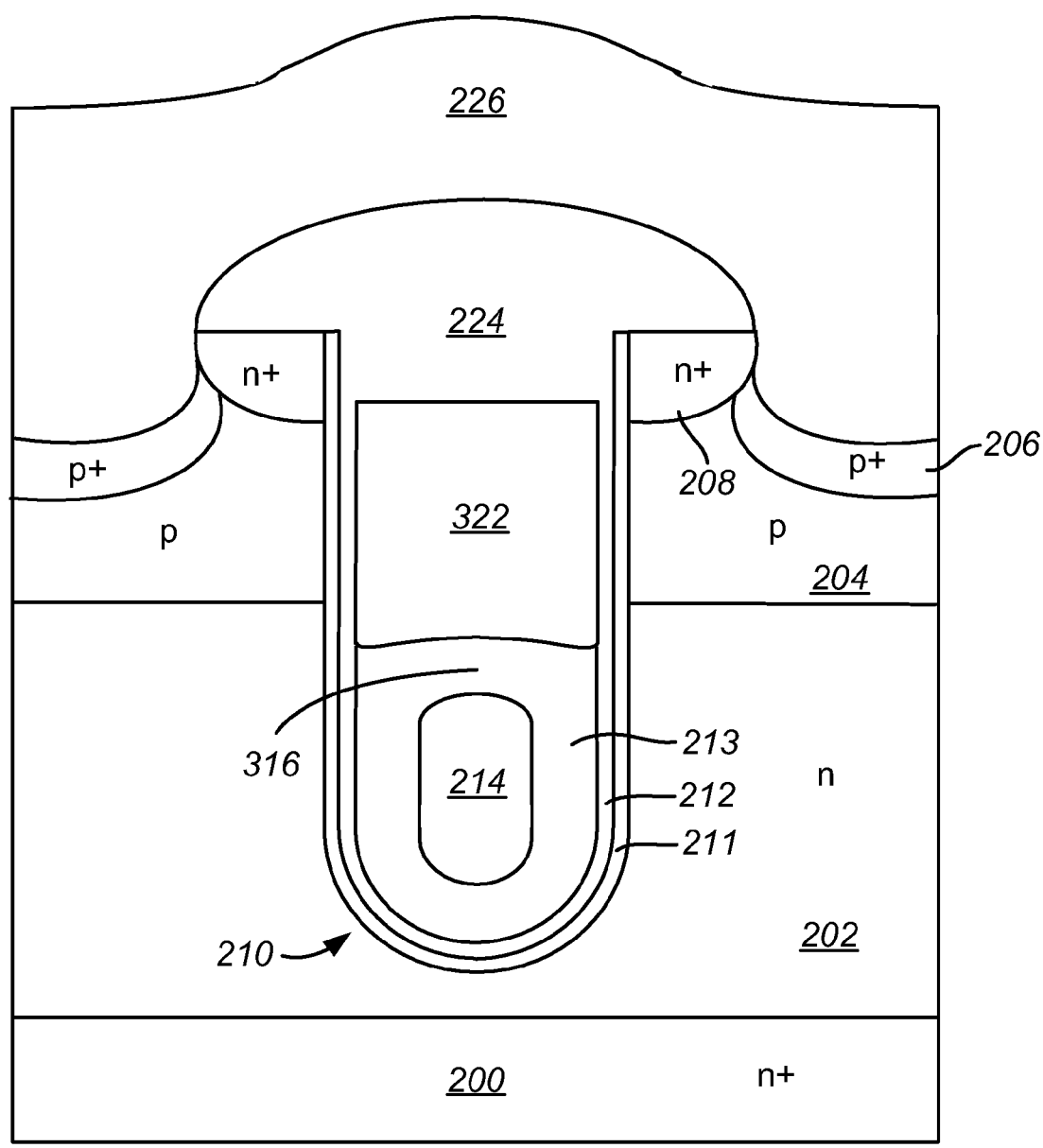

Any number of known process steps may next be carried out to complete the FET structure. FIG. 3D shows one exemplary MOSFET structure. Using conventional techniques, a recessed gate electrode 322 (e.g., comprising doped polysilicon) is formed in the trench over IED 316. As can be seen, unlike gate electrode 224 in FIG. 2J, gate electrode 322 in FIG. 3D does not have the downward spikes at its bottom corners. All other regions of the MOSFET in FIG. 3D may be formed using similar techniques to those described above in connection with the MOSFET structure in FIG. 2J. As in the FIG. 2J embodiment, the shield dielectric in FIG. 3D comprises three dielectric layers 211, 212, 213, whereas the gate dielectric comprises two dielectric layers 211, 212. In one embodiment, the middle dielectric layer 212 comprises a different dielectric material (e.g., silicon nitride) than the other two dielectric layers 211, 213 (e.g., oxide).

As described above, a nitride layer is used to protect the upper trench sidewalls and mesa surfaces during the thermal oxidation process(es) carried out to form the IED. In the above embodiments, the nitride layer forms part of the gate dielectric of the shielded gate trench FET. Few advantages are provided by the dual-layer gate dielectric of nitride and oxide. For example, nitride is known to be a barrier to mobile ions and moisture. Additionally, the dual-layer gate dielectric adds robustness to process defects. In certain applications, however, it may be desirable to exclude the nitride layer in the gate dielectric, because nitride is known to produce traps and charges. Accordingly, techniques for forming a shielded gate trench FET with a gate dielectric that does not include a nitride layer and yet maintains many of the advantages of the present invention are described next.

Figure 4A:
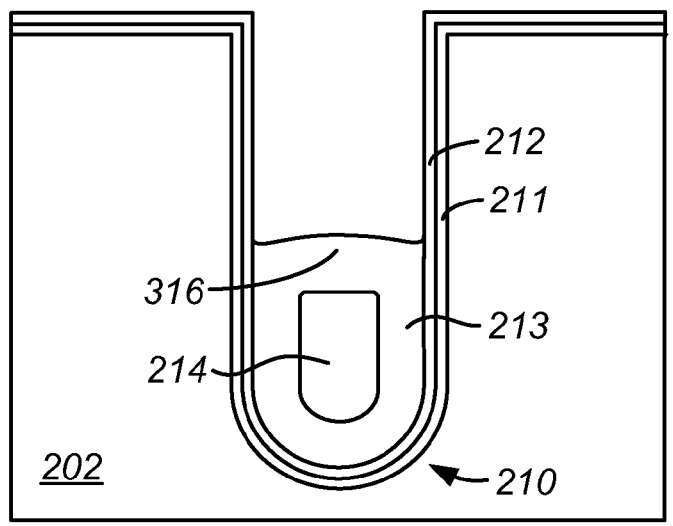
FIGS. 4A-4C are simplified cross-sectional views at various stages of a process for forming a shielded gate trench field effect transistor including an oxide gate dielectric according to an embodiment of the present invention.
Figure 4B:
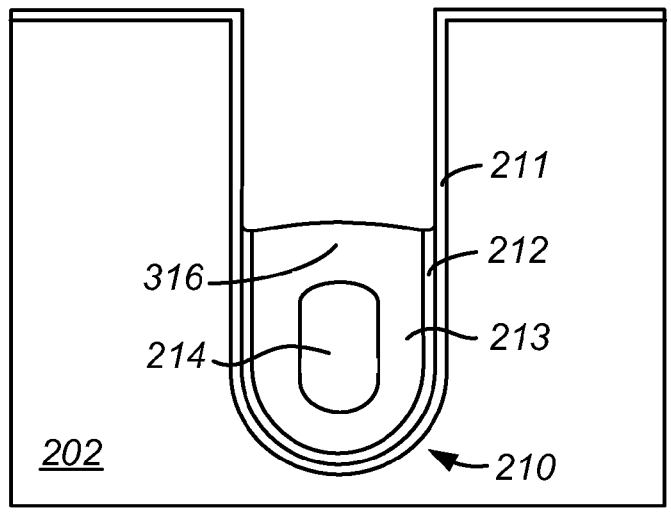
Figure 4C:
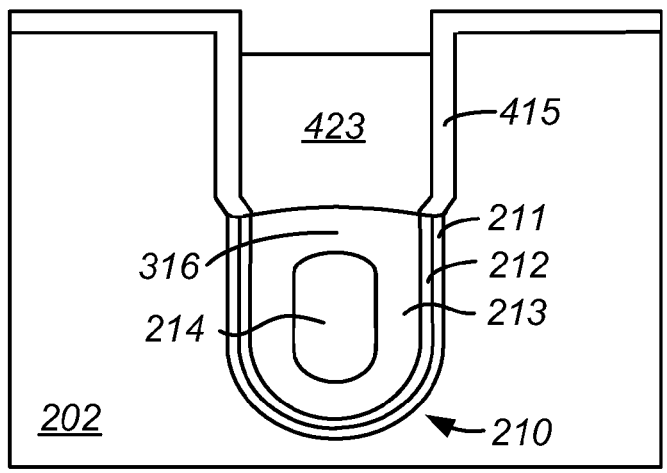

FIGS. 4A-4C are simplified cross-sectional views of a process for forming a shielded gate trench field effect transistor according to an embodiment of the present invention. FIG. 4A shows an intermediate structure that is similar to the structure in FIG. 3C, with corresponding regions marked with identical reference numerals. Thus, the process steps leading to the structure in FIG. 4A will not be described. While this embodiment uses a poly liner to eliminate the spikes in lower corners of the gate electrode, it is not limited as such. That is, the process sequence for this embodiment may be modified to eliminate the poly liner as in the embodiment of FIGS. 2A-2J.

In FIG. 4B, the exposed portions of nitride layer 212 are removed from upper trench sidewalls and over the mesa surfaces to expose first shield oxide 211. If first shield oxide 211 has the desired thickness to serve as the gate oxide, no further processing is necessary for forming the gate oxide, and the process can move to the step of forming the gate electrode. However, if first shield oxide 211 does not have the desired thickness to serve as a gate oxide, a thermal oxidation process may be carried out to form a gate oxide 415 to the desired thickness, as shown in FIG. 4C. Exposed portions of first oxide layer 211 extending along upper trench sidewalls may be removed prior to the thermal oxidation process if desired. Gate electrode 423 is formed in a similar manner to previous embodiments. The remaining regions and layers of the shielded gate trench FET can be formed using processes described above in connection with FIG. 2J.

Figure 5A:
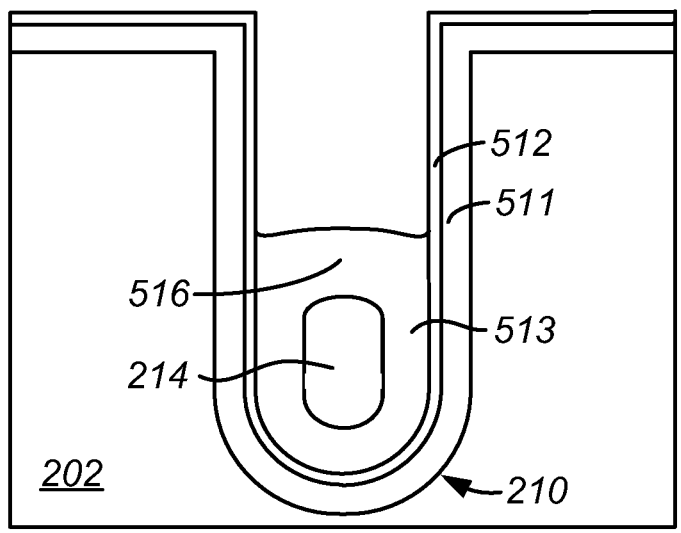
FIGS. 5A-5B are simplified cross-sectional views at various stages of a process for forming a shielded gate trench field effect transistor including an oxide gate dielectric according to an alternative embodiment of the present invention.
Figure 5B:
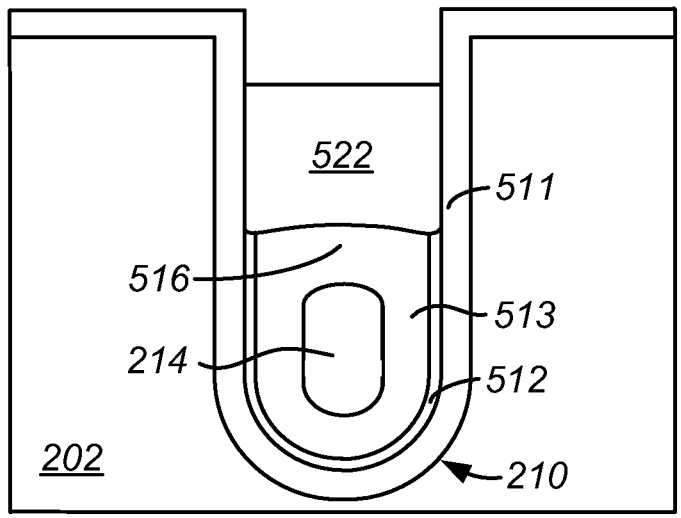

FIGS. 5A-5B are simplified cross-sectional views of a process for forming a shielded gate trench field effect transistor according to yet another embodiment of the present invention. FIG. 5A shows an intermediate process structure. First shield oxide layer 511 is formed to line sidewalls and a bottom surface of trench 210 using, for example, CVD process or oxidation of silicon. Shield nitride layer 512 overlying first shield oxide layer 511 is formed using known techniques. In this embodiment, the thickness of first shield oxide layer 511 is dictated by the target thickness of the gate dielectric. Second shield oxide layer 513 and shield electrode 214 are formed using techniques similar to those described above in connection with FIGS. 2D-2F. IED 516 is formed using a poly liner as depicted in FIGS. 3B-3C. Alternatively, IED 516 may be formed without using a poly liner as depicted in FIGS. 2G-2H.

In FIG. 5B, exposed portions of shield nitride layer 512 along upper trench sidewalls and over mesa surfaces are removed, and gate electrode 522 is formed with first shield oxide layer 511 serving as the gate dielectric. The remaining portions of the shielded gate trench FET can be formed using processes described above in connection with FIGS. 2I and 2J.

Figure 6A:
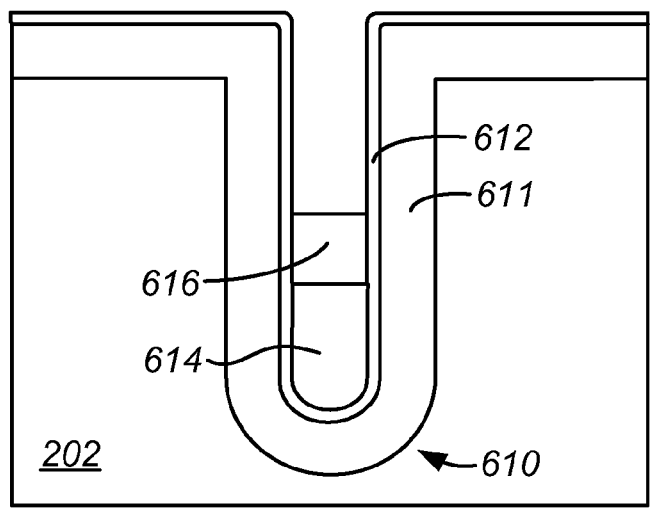
FIGS. 6A-6C are simplified cross-sectional views at various stages of a process for forming a shielded gate trench field effect transistor according to yet another embodiment of the present invention.
Figure 6B:
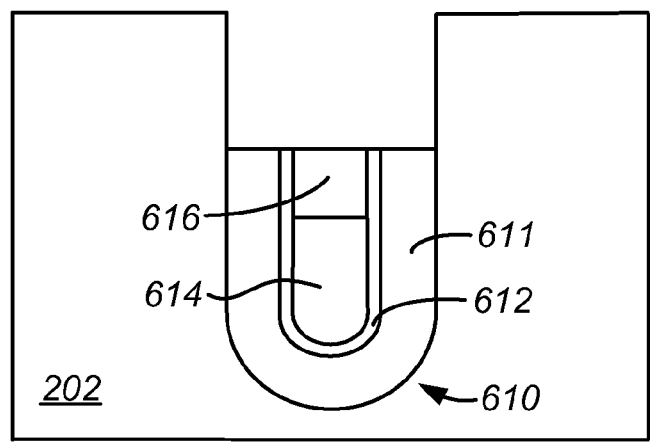
Figure 6C:
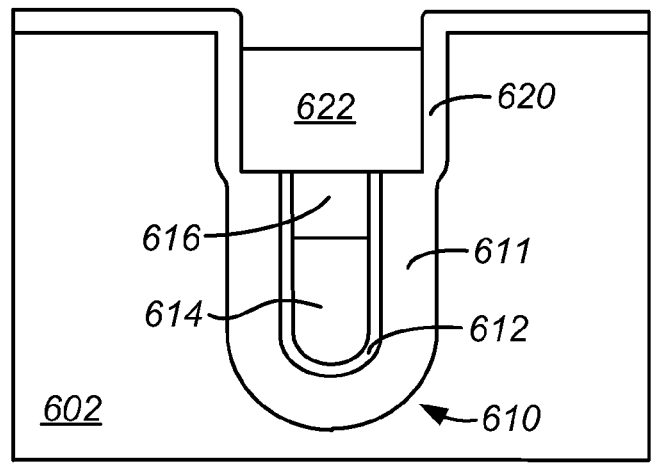

FIGS. 6A-6C are simplified cross-sectional views at various stages of a process for forming a shielded gate trench field effect transistor according to still another embodiment of the present invention. In FIG. 6A, trench 610 is formed in semiconductor region 602 using conventional techniques. A thick shield dielectric layer 611 (e.g., comprising oxide) lining sidewalls and bottom surface of the trench is formed using, for example, conventional CVD processes. Shield nitride layer 612 is formed to overlie shield dielectric layer 611 using known techniques. Shield electrode 614 (e.g., comprising polysilicon) is formed in a bottom portion of trench 610 using conventional techniques.

In FIG. 6A, shield dielectric layer 611 is thick enough to provide the necessary isolation between shield electrode 614 and semiconductor region 202. IED 616 is formed by thermally oxidizing shield electrode 614. Nitride layer 612, as in previous embodiments, serves to prevent oxidation of silicon along trench side walls and mesa surfaces during formation of IED 616. In FIG. 6B, portions of shield nitride layer 612 and shield dielectric layer 611 extending along upper trench sidewalls and over mesa regions are removed to expose silicon surfaces along upper trench sidewalls and mesa surfaces. While some of IED 616 may be removed during removal of portions of shield dielectric layer 611, a sufficient amount of IED 616 may initially be formed to ensure that the desired amount of IED 616 remains after removal of portions of shield dialect layer 611. For example, shield dielectric 611 may be an oxide layer of about 1200 Å thickness, and IED 616 may be formed to an initial thickness of 2500 Å or greater (as noted before, an advantage of the current invention is that the IED can be formed to any desired thickness because of the presence of the nitride layer). In etching shield dielectric 611 back, an equal amount of IED 616 is removed. Thus, about 1300 Å of IED would remain after dielectric layer 611 is etched back.

In FIG. 6C, gate dielectric 620 is formed along upper trench sidewalls using known thermal oxidation processes. Then, gate electrode 622 is formed using known techniques. The remaining portions of the shielded gate trench FET can be formed using processes described above in connection with FIGS. 2I and 2J.

Note that in the FIGS. 4A-4C, 5A-5B and 6A-6C embodiments, the step of removing the exposed silicon nitride layer from along the upper trench sidewalls and over the mesa may result in formation of small recesses at the upper surface of the IED. Such recesses may be eliminated by removing a thin layer of the IED. Removing a thin layer of the IED may lead to removal of a thin layer of the gate oxide along the upper trench sidewalls as well, however, the removal of a thin layer of the gate oxide can be accounted for by initially forming a thicker gate oxide.

The table below shows simulation results for $Q_{gd}$ and $Q_{gs}$ for various embodiments of the invention. $Q_{gd}$ is a measure of coupling capacitance $C_{gd}$ between the gate electrode and the drain. A lower coupling capacitance is usually associated with better switching performance. Similarly, $Q_{gs}$ is a measure of coupling capacitance between the gate and source of the trench FET. Five shielded gate trench MOSFETs included in the simulation study are listed below.
1. Conventional—conventional shielded gate trench MOSFET.
2. No Poly Liner—embodiment of invention without the polysilicon liner as described in FIGS. 2A-2J.
3. Poly Liner A—embodiment of invention including a polysilicon liner as described in FIGS. 3A-3C with first shield dielectric layer 211 being an oxide layer of 350 Å thickness and second shield dielectric layer 212 being a nitride layer of 200 Å thickness.
4. Poly Liner B—Second embodiment of invention including a polysilicon liner (e.g., as described in FIGS. 3A-3C) with first shield dielectric layer 211 being an oxide layer of 400 Å thickness and second shield dielectric layer 212 being a nitride layer of 100 Å thickness.
5. Poly liner C—Third embodiment of invention including a polysilicon liner (e.g., as described in FIGS. 3A-3C) with first shield dielectric layer 211 being an oxide layer of 400 Å thickness and second shield dielectric layer 212 being a nitride layer of 200 Å thickness.

| Samples | $Q_{gs}$ (nC/cm$^2$) | $Q_{gd}$ (nC/cm$^2$) |
| --- | --- | --- |
| 1. Conventional | 124 | 89 |
| 2. No Poly Liner | 96 | 66 |
| 3. Poly Liner A | 89 | 39 |
| 4. Poly Liner B | 102 | 42 |
| 5. Poly Liner C | 95 | 40 |

As can be seen, MOSFETs 2-5 have lower $Q_{gd}$ and $Q_{gs}$ than the conventional MOSFET 1, indicating the lower coupling capacitance as a result of the thicker IED. In particular, in MOSFETs 3-5, $Q_{gd}$ is more than 50% lower than the conventional MOSFET. The result of the simulation study clearly demonstrates improvements in switching performance obtained by various embodiments of the invention.

While the above provides a complete description of the preferred embodiments of the invention, many alternatives, modifications, and equivalents are possible. Those skilled in the art will appreciate that the same techniques can apply to other types of shielded gate trench FETs. For example, while embodiments of the invention are described in the context of n-channel MOSFETs, the principles of the invention may be applied to p-channel MOSFETs by merely reversing the conductivity type of the various regions. Additionally, the principle of the invention can also be applied to shielded gate IGBTs by merely reversing the conductivity of the substrate. For example, by merely changing the conductivity type of substrate 200 in FIGS. 2J and 3D from n-type to p-type, n-channel IGBT counterparts of the MOSFETs in FIGS. 2J and 3D are obtained with the same advantages outlined above. P-channel IGBTs can be obtained by reversing the conductivity type of the various regions except for the substrate. Therefore, the above description should not be taken as limiting the scope of the invention, which is defined by the appended claims.

What is claimed is:
1. A shielded gate field effect transistor, comprising:
a trench extending into a semiconductor region;
a shield electrode disposed in a lower portion of the trench, the shield electrode being insulated from the semiconductor region by a shield dielectric comprising a shield portion of a first dielectric layer, at least a shield portion of a second dielectric layer, and a third dielectric layer, the first dielectric layer disposed in both the lower portion of the trench and an upper portion of the trench and disposed, at least in part, between the second dielectric layer and the semiconductor region,
the second dielectric layer disposed, at least in part, between the first dielectric layer and the third dielectric layer, the second dielectric layer comprising a material configured to inhibit growth of oxide along a surface of the semiconductor region covered by the second dielectric layer, and
the third dielectric layer disposed in the lower portion of the trench and not disposed in the upper portion of the trench;
an inter-electrode dielectric disposed between the shield electrode and a gate electrode, the gate electrode being disposed in the upper portion of the trench; and
a gate dielectric lining an upper portion sidewall of the trench and comprising a gate portion of the first dielectric layer, the inter-electrode dielectric having a thickness that is greater than a thickness of the gate dielectric.
2. The shielded gate field effect transistor of claim 1 wherein the first dielectric layer comprises an oxide layer and the second dielectric layer comprises a silicon nitride layer.
3. The shielded gate field effect transistor of claim 1 wherein a gate portion of the second dielectric layer is disposed along the upper portion sidewall of the trench, and the gate dielectric includes the gate portion of the second dielectric layer.
4. The shielded gate field effect transistor of claim 3 wherein the first dielectric layer comprises an oxide layer and the second dielectric layer comprises a silicon nitride layer.
5. The shielded gate field effect transistor of claim 1 wherein the first dielectric layer comprises an oxide layer, the second dielectric layer comprises a silicon nitride layer, and the gate dielectric comprises a gate oxide layer.
6. The shielded gate field effect transistor of claim 5 wherein the silicon nitride layer is a first silicon nitride layer, the gate dielectric further comprising a second silicon nitride layer.
7. The shielded gate field effect transistor of claim 1 wherein the semiconductor region comprises:
a drift region of a first conductivity type;

a body region of a second conductivity type extending over the drift region; and a source region of the first conductivity type disposed in the body region and adjacent to the trench.

8. The shielded gate field effect transistor of claim 7 wherein the gate electrode includes a top surface recessed in the trench to a depth below a top surface of the semiconductor region, the shielded gate field effect transistor further comprising:
an interconnect layer contacting the source region and the body region; and
a dielectric material disposed over the gate electrode and configured to insulate the gate electrode from the interconnect layer.

9. The shielded gate field effect transistor of claim 7 wherein the semiconductor region includes a substrate of the first conductivity type, the drift region extends over the substrate, and
the trench extends through the body region and into the drift region.

10. The shielded gate field effect transistor of claim 7 wherein the semiconductor region including a substrate of the second conductivity type, the drift region extends over the substrate, and
the trench extends through the body region and into the drift region.

11. The shielded gate field effect transistor of claim 1 wherein the first dielectric layer comprises an oxide layer having a thickness within a range of 50-500 Angstroms.

12. The shielded gate field effect transistor of claim 1 wherein the second dielectric layer comprises a silicon nitride layer having a thickness within a range of 100-300 Angstroms.

13. The shielded gate field effect transistor of claim 1 wherein the inter-electrode dielectric comprises a thermal oxide that has a thickness greater than the thickness of the gate dielectric.

14. The shielded gate field effect transistor of claim 1 wherein the first dielectric layer comprises a first oxide layer;
the second dielectric layer comprises a silicon nitride layer; and
the third dielectric layer comprises a second oxide layer.

15. The shielded gate field effect transistor of claim 1 wherein the third dielectric layer has a thickness greater than a thickness of each of the first and second dielectric layers.

16. The shielded gate field effect transistor of claim 1 wherein the third dielectric layer comprises an oxide layer having a thickness within a range of 500-5,000 Angstroms.

17. A shielded gate field effect transistor, comprising:
a semiconductor region comprising a drift region of a first conductivity type and a body region of a second conductivity type extending over the drift region;
a trench extending through the body region and into the drift region;
a source region of the first conductivity type disposed in the body region adjacent the trench;
a first oxide layer disposed along an upper sidewall portion of the trench, a lower sidewall portion of the trench and a bottom portion of the trench;

a silicon nitride layer extending, at least partially, over the first oxide layer disposed along the upper and lower sidewall portions and the bottom portion of the trench;
a second oxide layer extending, at least partially, over the silicon nitride layer along the lower sidewall portion and the bottom portion of the trench;
a shield electrode disposed in a lower portion of the trench, the shield electrode being insulated from the drift region by the first oxide layer, the silicon nitride layer and the second oxide layer;
an inter-electrode dielectric covering the shield electrode; and
a gate electrode disposed in an upper portion of the trench over the inter-electrode dielectric, the gate electrode being insulated from the body region by the first oxide layer and the silicon nitride layer but not the second oxide layer.

18. The shielded gate field effect transistor of claim 17 wherein the semiconductor region further includes a substrate of the first conductivity type, and the drift region extends, at least partially, over the substrate.

19. The shielded gate field effect transistor of claim 17 wherein the semiconductor region further includes a substrate of the second conductivity type, and the drift region extends, at least partially, over the substrate.

20. The shielded gate field effect transistor of claim 17 wherein the inter-electrode dielectric comprises a thermal oxide and has a thickness greater than a combined thicknesses of the first oxide layer and the silicon nitride layer.

21. The shielded gate field effect transistor of claim 17 wherein the second oxide layer has a thickness greater than either of a thickness of the first oxide layer or a thickness of the silicon nitride layer.

22. The shielded gate field effect transistor of claim 17 wherein the first oxide layer has a thickness within a range of 50-500 Angstroms, the silicon nitride layer has a thickness within a range of 100-300 Angstroms, and the second oxide layer has a thickness within a range of 500-5,000 Angstroms.

23. An apparatus comprising:
a trench extending into a semiconductor region;
a shield electrode disposed in a lower portion of the trench;
a first dielectric layer disposed in both the lower portion of the trench and an upper portion of the trench and disposed, at least in part, between a second dielectric layer and the semiconductor region;
the second dielectric layer disposed, at least in part, between the first dielectric layer and a third dielectric layer, and disposed in the lower portion of the trench but not disposed in the upper portion of the trench;
the third dielectric layer disposed in the lower portion of the trench and not disposed in the upper portion of the trench; and
an inter-electrode dielectric disposed between the shield electrode and a gate electrode, the gate electrode being disposed in the upper portion of the trench.

24. The apparatus of claim 23, wherein
the first dielectric layer comprises a first oxide layer,
the second dielectric layer comprises a silicon nitride layer, and
the third dielectric layer comprises a second oxide layer.

* * * * *